United States Patent
Xiao et al.

(10) Patent No.: US 10,868,103 B2
(45) Date of Patent: Dec. 15, 2020

(54) WIRING STRUCTURE AND MANUFACTURE METHOD THEREOF, OLED ARRAY SUBSTRATE AND DISPLAY DEVICE

(71) Applicant: BOE TECHNOLOGY GROUP CO., LTD., Beijing (CN)

(72) Inventors: Li Xiao, Beijing (CN); Minghua Xuan, Beijing (CN); Shengji Yang, Beijing (CN); Xiaochuan Chen, Beijing (CN); Lei Wang, Beijing (CN); Jie Fu, Beijing (CN); Pengcheng Lu, Beijing (CN); Dongni Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/303,825

(22) PCT Filed: May 11, 2018

(86) PCT No.: PCT/CN2018/086460
§ 371 (c)(1),
(2) Date: Nov. 21, 2018

(87) PCT Pub. No.: WO2019/024565
PCT Pub. Date: Feb. 7, 2019

(65) Prior Publication Data
US 2019/0363155 A1 Nov. 28, 2019

(30) Foreign Application Priority Data

Aug. 2, 2017 (CN) .......................... 2017 1 0650543

(51) Int. Cl.
*H01L 27/32* (2006.01)
*H01L 27/12* (2006.01)

(52) U.S. Cl.
CPC ........ *H01L 27/3279* (2013.01); *H01L 27/124* (2013.01); *H01L 2227/323* (2013.01)

(58) Field of Classification Search
CPC ........... H01L 27/3279; H01L 2227/323; H01L 27/124
See application file for complete search history.

(56) References Cited

U.S. PATENT DOCUMENTS

2002/0084107 A1* 7/2002 Chang .................... H01L 23/66
174/262
2002/0149312 A1* 10/2002 Roberts .................. F21V 29/56
313/495

(Continued)

FOREIGN PATENT DOCUMENTS

| CN | 1964062 A | 5/2007 |
|---|---|---|
| CN | 103745985 A | 4/2014 |

(Continued)

OTHER PUBLICATIONS

International Search Report and Written Opinion dated Jul. 31, 2018 from State Intellectual Property Office of the P.R. China.
Chinese Office Action dated Feb. 25, 2020.

*Primary Examiner* — Feifei Yeung Lopez
(74) *Attorney, Agent, or Firm* — Dilworth & Barrese, LLP.; Michael J. Musella, Esq.

(57) ABSTRACT

A wiring structure and a manufacture method thereof, an organic light-emitting diode (OLED) array substrate and a display device are provided, the wiring structure includes: a base substrate, the base substrate includes a first surface and a second surface which are opposite to each other; a first conductive pattern arranged on the first surface of the base substrate and a second conductive pattern arranged on the second surface of the base substrate; the first conductive pattern is connected with the second conductive pattern through a via hole pattern penetrating through the base (Continued)

substrate. In the case that the wiring structure is applied to the organic light-emitting diode (OLED) array substrate, the display uniformity can be improved.

13 Claims, 4 Drawing Sheets

(56) References Cited

U.S. PATENT DOCUMENTS

| | | | |
|---|---|---|---|
| 2005/0127367 A1* | 6/2005 | Huh | H01L 27/1214 257/72 |
| 2007/0103063 A1 | 5/2007 | Kim | |
| 2011/0180308 A1* | 7/2011 | Nakamura | H01L 51/5268 174/255 |
| 2012/0025700 A1* | 2/2012 | Ryu | H01L 51/5243 313/512 |
| 2014/0291661 A1 | 10/2014 | Ono et al. | |
| 2015/0255338 A1 | 9/2015 | Xiao et al. | |
| 2016/0071919 A1 | 3/2016 | Chen | |

FOREIGN PATENT DOCUMENTS

| | | |
|---|---|---|
| CN | 103907218 A | 7/2014 |
| CN | 105390506 A | 3/2016 |
| CN | 106450019 A | 2/2017 |

* cited by examiner

WIRING STRUCTURE AND MANUFACTURE METHOD THEREOF, OLED ARRAY SUBSTRATE AND DISPLAY DEVICE

The present application claims the priority of the Chinese Patent Application No. 201710650543.1 filed on Aug. 2, 2017, which is incorporated herein by reference as part of the disclosure of the present application.

TECHNICAL FIELD

Embodiments of the present disclosure relate to a wiring structure and a manufacture method of the wiring structure, an organic light-emitting diode (OLED) array substrate and a display device.

BACKGROUND

An organic light-emitting diode (OLED) is a device that emits light by electro-exciting fluorescent organic compounds or phosphor organic compounds. The organic light-emitting diode (OLED) is considered to have great application prospects in the field of display due to its advantages of self-luminescence, all-solid-state, wide viewing angle and fast response. The organic light-emitting diode (OLED) has been widely used in mobile phones, digital cameras, personal digital assistants (PDAs) and laptops.

The organic light-emitting diode (OLED) array substrate comprises a plurality of pixel units, each of the pixel units comprises a switching transistor, a driving transistor and an OLED display device. The OLED is a current-driven light-emitting device, which mainly comprises an anode, a cathode and an organic material functional layer. The main working principle of the OLED is that: under an electric field formed between the anode and the cathode, the organic material functional layer emits light due to carriers injection and recombination. The driving transistor connected to the anode or the cathode of OLED plays a role of limiting current, in a case that a resistivity of the electrode material of the driving transistor is too large or a resistance of a power line is too large, a great voltage drop or a great voltage rising is prone to be occurred, which makes different influences on the pixel units at different positions, and makes adversely influence on the uniformity of display.

SUMMARY

At least one embodiment of the present disclosure provides a wiring structure, and the wiring structure comprises: a base substrate, the base substrate comprises a first surface and a second surface which are opposite to each other; a first conductive pattern arranged on the first surface of the base substrate and a second conductive pattern arranged on the second surface of the base substrate; and the first conductive pattern is connected with the second conductive pattern through a via hole pattern penetrating through the base substrate.

For example, in the wiring structure provided by at least one embodiment of the present disclosure, the second conductive pattern comprises a plurality of second sub-conductive patterns spaced apart from each other, the via hole pattern comprises a plurality of via holes, and the first conductive pattern is connected with each of the second sub-conductive patterns through the via holes respectively.

For example, in the wiring structure provided by at least one embodiment of the present disclosure, the via holes are arranged at equal interval.

For example, in the wiring structure provided by at least one embodiment of the present disclosure, each of the second sub-conductive patterns has a structure in a grid shape.

At least one embodiment of the present disclosure further provides an organic light-emitting diode (OLED) array substrate, and the organic light-emitting diode (OLED) array substrate comprises any one of the above mentioned wiring structures.

For example, in the organic light-emitting diode (OLED) array substrate provided by at least one embodiment of the present disclosure, both the first conductive pattern and the second conductive pattern are configured as power lines of the OLED array substrate.

For example, in the organic light-emitting diode (OLED) array substrate provided by at least one embodiment of the present disclosure, the OLED array substrate comprises pixel structures which are arranged in an array, and each of the pixel structures is connected with the first conductive pattern.

At least one embodiment of the present disclosure further provides a display device, and the display device comprises any one of the above mentioned organic light-emitting diode (OLED) array substrates.

For example, the display device provided by at least one embodiment of the present disclosure further comprises a driving circuit, the first conductive pattern is connected to the driving circuit, and the plurality of the second sub-conductive patterns are connected to the driving circuit respectively.

At least one embodiment of the present disclosure further provides a manufacture method of the wiring structure, and the manufacture method comprises: providing a base substrate; forming a via hole pattern penetrating through the base substrate; forming a first conductive pattern on a first surface of the base substrate; and forming a second conductive pattern on a second surface of the base substrate; and the first conductive pattern is connected with the second conductive pattern through the via hole pattern.

For example, in the manufacture method provided by at least one embodiment of the present disclosure, the via hole pattern is formed by a laser irradiation method.

For example, the manufacture method provided by at least one embodiment of the present disclosure comprises: forming the via hole pattern penetrating through the base substrate firstly, and then forming the first conductive pattern on the first surface of the base substrate.

For example, the manufacture method provided by at least one embodiment of the present disclosure comprises: forming the first conductive pattern on the first surface of the base substrate firstly, and then forming the via hole pattern penetrating through the base substrate.

For example, in the manufacture method provided by at least one embodiment of the present disclosure, forming the via hole pattern comprises forming a plurality of via holes.

For example, in the manufacture method provided by at least one embodiment of the present disclosure, the second conductive pattern comprises a plurality of second sub-conductive patterns spaced apart from each other, and the first conductive pattern is connected with each of the second sub-conductive patterns through the via holes respectively.

For example, in the manufacture method provided by at least one embodiment of the present disclosure, the via holes are arranged at equal interval.

For example, in the manufacture method provided by at least one embodiment of the present disclosure, each of the second sub-conductive patterns has a structure in a grid shape.

BRIEF DESCRIPTION OF THE DRAWINGS

In order to clearly illustrate the technical solution of the embodiments of the disclosure, the drawings of the embodiments will be briefly described. It is apparent that the described drawings are only related to some embodiments of the disclosure and thus are not limitative of the disclosure.

REFERENCE NUMERALS

Figure 1A:
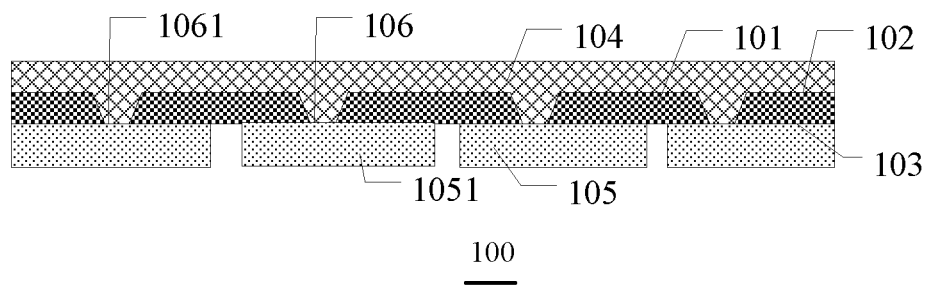
FIG. 1A and FIG. 1B are schematic diagrams of a sectional structure of a wiring structure provided by an embodiment of the present disclosure.

100—wiring structure;
101, 201—base substrate;
102—first surface;
103—second surface;
104—first conductive pattern;
105—second conductive pattern;
1051, 1051a, 1051b, 1051c, 1051d—second sub-conductive pattern;
106—via hole pattern;
1061—via hole;
110—driving circuit layer;
202—power line;
203—gate line;
204—data line;
205—pixel structure;
206—switching transistor;
207—driving transistor;
208—OLED device;
210—first via hole structure.

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure.

Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may include an electrical connection which is direct or indirect. The terms "on," "under," "right," "left" and the like are only used to indicate relative position relationship, and when the position of an object is described as being changed, the relative position relationship may be changed accordingly.

In actual products, a size of a wiring structure and sizes of patterns in an OLED array substrate in embodiments of the present disclosure are usually in a micron scale or a smaller scale. For clarity, the sizes of the structures in drawings of the embodiments of the present disclosure are enlarged, unless specified stated, the sizes and proportions in the drawings do not represent actual sizes and proportions.

Inventors of the present disclosure find that in the current OLED array substrate structure, VDD lines or VSS lines have resistance. In a case that a current passes through the VDD lines or the VSS lines, a voltage drop on the VDD lines or a voltage rising on the VSS lines makes influence on the luminous current, which leads to a certain difference in the signal amplitude of the VDD lines or the VSS lines. Considering that the characteristics of thin film transistors (TFTs) are not ideal (current in a saturation region is not only related to Vgs, but also related to Vds), the voltage drop on the VDD lines or the voltage rising on the VSS lines affects the Vds. Therefore, the currents output from OLED sub-pixels at different positions vary with the change of VDD voltage or VSS voltage, which results in the uniformity of display. Therefore, the resistance of VDD lines and the VSS lines require to be reduced as much as possible, so as to reduce the voltage drop on the VDD lines and the voltage rising on the VSS lines.

At least one embodiment of the present disclosure provides a wiring structure, and the wiring structure comprises: a base substrate, in which the base substrate comprises a first surface and a second surface which are opposite to each other; a first conductive pattern arranged on the first surface of the base substrate and a second conductive pattern arranged on the second surface of the base substrate; and the first conductive pattern is connected with the second conductive pattern through a via hole pattern penetrating through the base substrate.

In a case that the wiring structure is used in an OLED array substrate, the first conductive pattern is a pattern of the VDD lines or a pattern of the VSS lines. Because the first conductive pattern is connected to the second conductive pattern through a via hole pattern penetrating through the base substrate, the resistance of the VDD lines or the resistance of the VSS lines can be reduced, thus the voltage drop on the VDD lines and the voltage rising on the VSS lines can be reduced, and the uniformity of the display can be improved.

Figure 1B:
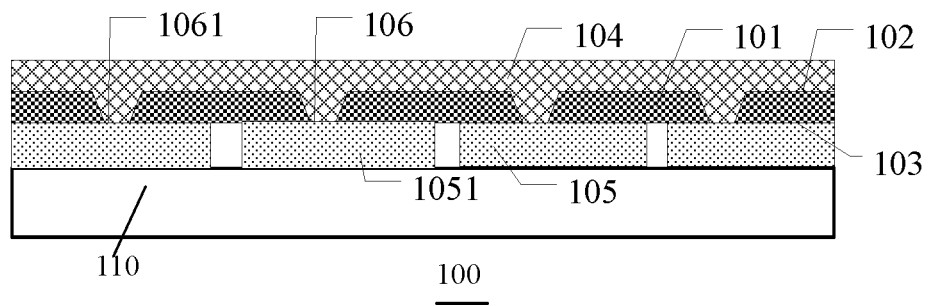

At least one embodiment of the present disclosure provides a wiring structure, FIG. 1A and FIG. 1B are schematic diagrams of a sectional structure of a wiring structure provided by an embodiment of the present disclosure, as illustrated in FIG. 1A and FIG. 1B, the wiring structure 100 comprises: a base substrate 101 comprising a first surface 102 and a second surface 103 which are opposite to each other; a first conductive pattern 104 arranged on the first surface 102 of the base substrate 101 and a second conductive pattern 105 arranged on the second surface 103 of the base substrate 101; and the first conductive pattern 104 is connected with the second conductive pattern 105 through a via hole pattern 106 penetrating through the base substrate 101.

For example, the base substrate 101 is an insulating substrate, and a material of the base substrate 101 is glass, quartz, resin material with a certain hardness or other suitable materials.

For example, a material of the first conductive pattern 104 and a material of the second conductive pattern 105 are both copper-based metals, for example, copper (Cu), copper-molybdenum alloy (Cu/Mo), copper-titanium alloy (Cu/Ti), copper-molybdenum-titanium alloy (Cu/Mo/Ti), copper-molybdenum-tungsten alloy (Cu/Mo/W), copper-molybdenum-niobium alloy (Cu/Mo/Nb), etc. For example, the material of the first conductive pattern 104 and the material of the second conductive pattern 105 are both chromium-based metals, such as chromium-molybdenum alloy (Cr/Mo), chromium-titanium alloy (Cr/Ti), chromium-molydenum-titanium alloy (Cr/Mo/Ti) or other suitable conductive metal materials.

For example, in a case that the first conductive pattern 104 is connected with the second conductive pattern 105 to form a double-layer structure, the resistance of the first conductive pattern 104 is greatly reduced compared with the first conductive pattern 104 having a single-layer structure.

For example, the first conductive pattern 104 has a grid shape formed by intersecting metal lines (strips), in this way, a plurality of meshes are formed, and the grid shape further reduces the resistance.

For example, the first conductive pattern 104 is a planar structure (rather than a single strip or a single line) formed by metal grids. In a case that the first conductive pattern is applied to a display panel, the voltage drop or the voltage rising of the first conductive pattern is reduced, thus an energy consumption of the display panel is reduced. It should be noted that, the conductive pattern with a planar structure means that the conductive pattern has a certain size and a certain extension range in a direction of width and a direction of length.

For example, as illustrated in FIG. 1A and FIG. 1B, the second conductive pattern 105 comprises a plurality of second sub-conductive patterns 1051 spaced apart from each other, the via hole pattern 106 comprises a plurality of via holes 1061, and the first conductive pattern 104 is connected with each second sub-conductive patterns 1051 through the via holes 1061 respectively.

For example, the via hole pattern 106 is formed by perforation techniques such as laser irradiation. For example, energy of laser irradiation is 700 mJ to 900 mJ, and the time is 6 seconds to 10 seconds. In an example, the energy of laser irradiation is 800 mJ and the time is 10 seconds. In another example, the energy of laser irradiation is 850 mJ and the time is 9 seconds.

For example, the wiring structure as illustrated in FIG. 1B is used in a display substrate of a display device. For example, the wiring structure is used in the display substrate of an OLED display device. A driving circuit layer 110 for driving an OLED pixel array is formed on a side of the second conductive pattern 105. In this way, the first conductive pattern 104 and the second conductive pattern 105 are configured as a cathode (for example, a common cathode), an anode (for example, a common anode), or power lines of the pixel array, etc.

Figure 2:
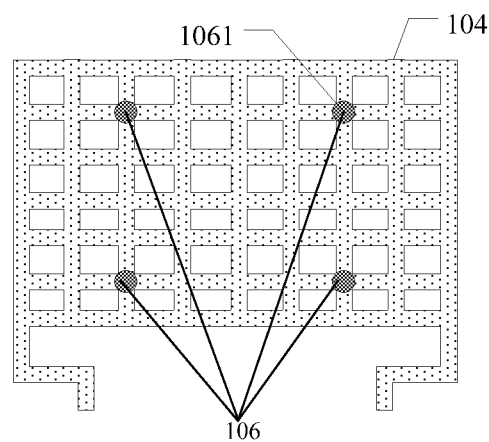
FIG. 2 is a partial structure schematic diagram of a wiring structure comprising a first surface provided by an embodiment of the present disclosure.

For example, FIG. 2 is a partial structure schematic diagram of a wiring structure comprising a first surface provided by an embodiment of the present disclosure. As illustrated in FIG. 2, the first conductive pattern 104 is a rectangular grid structure. Input terminals are provided on both sides of the rectangular grid structure, and the input terminals are connected with IC or FPC respectively. The via hole pattern 106 on the base substrate corresponds to the metal material of the rectangular grid structure rather than the meshes. As illustrated in FIG. 2, the via hole pattern 106 comprises four via holes 1061, which correspond to intersections of the metal lines (strips) extending vertically and horizontally on the first surface of the wiring structure, so as to ensure that the first conductive pattern 104 is connected with the subsequent formed second conductive pattern. For example, as illustrated in FIG. 2, a distance between any two of the via holes 1061 adjacent to each other in a horizontal direction is equal to a distance between any two of the via holes 1061 adjacent to each other in a vertical direction. The equal interval between any two of the via holes adjacent to each other eliminates the problem that the inconsistency of the length of the lines leads to the large difference of the input electric signals, so as to control the electrical signals input to each second sub-conductive patterns 1051 more accurately.

Figure 3:
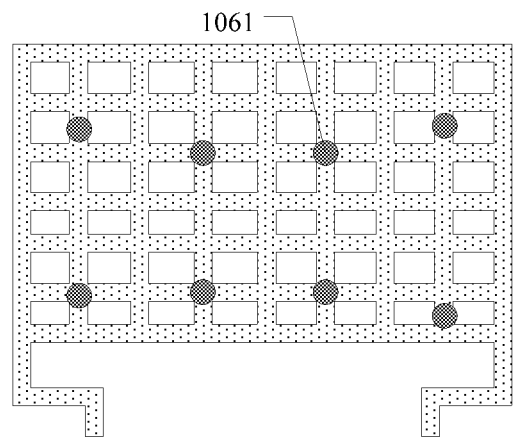
FIG. 3 is another partial structure schematic diagram of a wiring structure comprising a first surface provided by embodiment of the present disclosure.

For example, FIG. 3 is another partial structure schematic diagram of a wiring structure comprising a first surface provided by embodiment of the present disclosure. As illustrated in FIG. 3, the number of the via holes 1061 included in the via hole pattern is 8. It should be noted that, the number of the via holes 1061 is not limited to 4 in FIGS. 2 and 8 in FIG. 3, the number of the via holes may also be 2, 3 or 5, etc. Of course, in a case that the number of the via holes 1061 is 1, it can also reduce the resistance of the first conductive pattern, but the effect is not obvious in improving the uniformity of the display.

For example, in the structure illustrated in FIG. 3, eight via holes 1061 forms eight connection channels, which further reduces the resistance of the first conductive pattern. For example, as illustrated in FIG. 3, distances between any two of the via holes 1061 adjacent to each other are not the same. For example, the via holes are only at the positions corresponding to the metal lines (strips) in the horizontal direction, or only at the positions corresponding to the metal lines (strips) in the vertical direction.

It should be noted that, the shape of grid structure is not limited to the rectangle, it can also be a circle, a regular polygon, a trapezoid, or an irregular polygon.

For example, in an example, each column of pixel structures (sub-pixels) corresponds to a single the first conductive pattern in a grid shape. In this way, a plurality of first conductive patterns in the grid shape are connected to each other to form an integrated structure, which increases the area of the first conductive pattern, and further the voltage drop or voltage rising of the first conductive pattern is reduced. In a case that the wiring structure is used in the display panel, the uniformity of display is improved, and at the same time the power consumption of the display panel is reduced.

For example, in another example, a plurality of pixel structures (sub-pixels) correspond to a single first conductive pattern in a planar shape, that is, the first conductive pattern corresponds to a whole region of the pixel structure.

Figure 4:
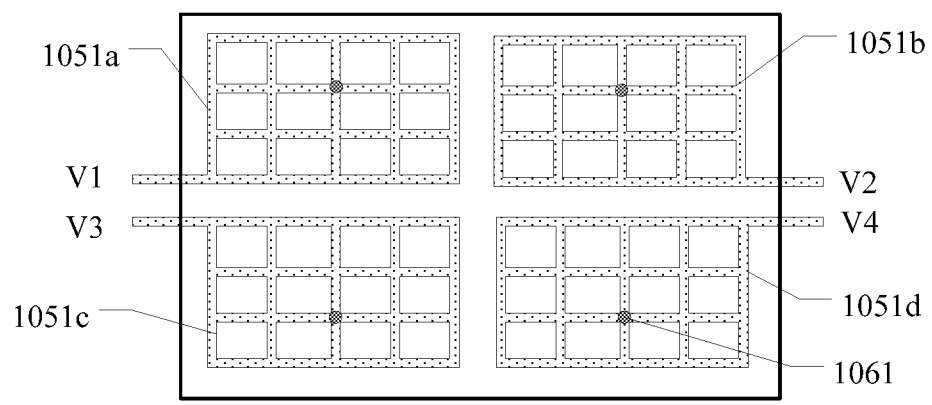
FIG. 4 is a partial structure schematic diagram of a wiring structure comprising a second surface provided by an embodiment of the present disclosure.

For example, FIG. 4 is a partial structure schematic diagram of a wiring structure comprising a second surface provided by an embodiment of the present disclosure. A structure of the second surface of the wiring structure in FIG. 4 is combined with a structure of the first surface of the wiring structure in FIG. 2 to form a wiring structure. As illustrated in FIG. 4, four second sub-conductive patterns 1051 (comprising 1051a, 1051b, 1051c, 1051d) are spaced apart from each other, that is, four second sub-conductive patterns 1051 are not electrically connected to each other on the second surface of the wiring structure. As illustrated in FIG. 4, each second sub-conductive patterns 1051 corresponds to at least one via hole 1061 penetrating the base substrate, so that each of the second sub-conductive patterns 1051 is electrically connected to the first conductive pattern (not shown) through the via hole 1061 respectively.

Figure 5:
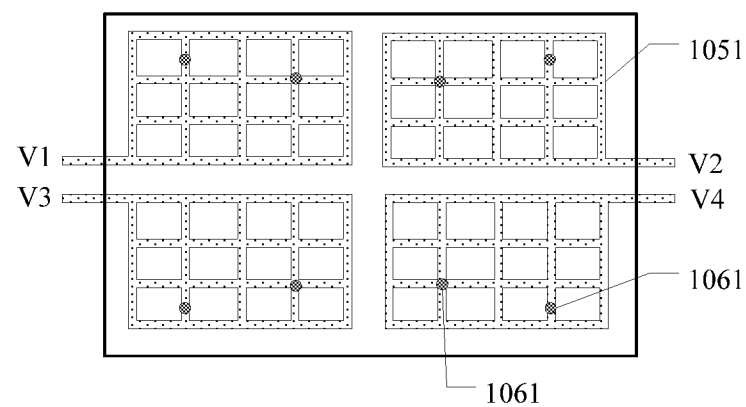
FIG. 5 is another partial structure schematic diagram of a wiring structure comprising a second surface provided by an embodiment of the present disclosure.

For example, FIG. 5 is another partial structure schematic diagram of a wiring structure comprising a second surface provided by an embodiment of the present disclosure. A structure of the second surface of the wiring structure in FIG. 5 is combined with a structure of the first surface of the wiring structure in FIG. 3 to form a wiring structure. Each of the second sub-conductive patterns 1051 corresponds to a plurality of via holes 1061 at different positions. As illustrated in FIG. 5, each of the second sub-conductive patterns 1051 corresponds to two via holes 1061, and each of the second sub-conductive patterns 1051 is electrically connected with the first conductive pattern at two different positions, in this way, the resistance of the first conductive pattern 104 is further reduced.

For example, the second sub-conductive pattern 1051 has a structure in a grid shape, and the shapes of each second sub-conductive patterns 1051 are the same or are different from each other. For example, the shape of the second sub-conductive pattern 1051 is not limited to a rectangle, but may also be a circle, a regular polygon, a trapezoid or an irregular polygon, etc.

For example, the first conductive pattern 104 in FIG. 3 is connected to the second sub-conductive patterns 1051, which are spaced apart from each other, through the via holes 1061 respectively. In this way, the voltage at the junction of the first conductive pattern 104 and a second sub-conductive pattern 1051 in a small region can be adjusted by controlling the input voltage of a second sub-conductive pattern 1051 individually. In this way, the voltage rising or the voltage drop in the first conductive pattern 104 is almost close to zero by controlling the input voltage in a small region individually. In this way, the uniformity of display is improved in a case that the wiring structure is applied to the display panel.

In a case of using the wiring structure, the wiring structure provided by at least one embodiment of the present disclosure is connected to a driving circuit. For example, the first conductive pattern is connected to the driving circuit through an input terminal, and each of the second sub-conductive patterns is connected to the driving circuit through respective input terminals of the second sub-conductive patterns. Taking the wiring structure composed of the first conductive pattern on the first surface as illustrated in FIG. 2 and the second sub-conductive patterns on the second surface as illustrated in FIG. 4 for example. Assuming that the voltage value input the first conductive pattern 104 is V0, the voltage at the junction of the first conductive pattern 104 and the second sub-conductive pattern 1051a is detected to be V1', in a case that the V0 is equal to or substantially equal to V1', it does not need to apply voltage to the second sub-conductive pattern 1051a. In a case that there is a large difference between V0 and V1', a voltage should be applied to the second sub-conductive pattern 1051a to make V0 and V1' equal to or substantially equal to each other, and for example, the voltage applied to the second sub-conductive pattern 1051a is V1.

Similarly, assuming that the voltage value input to the first conductive pattern 104 is V0, the voltages at the junction of the first conductive pattern and the second sub-conductive pattern 1051b, at the junction of the first conductive pattern and the second sub-conductive pattern 1051c, and at the junction of the first conductive pattern and the second conductive pattern 1051d are detected to be V2', V3', and V4' respectively. If V0 is equal to or substantially equal to V2', V3', or V4', no voltage is applied to the second sub-conductive pattern 1051b, the second sub-conductive pattern 1051c or the second sub-conductive pattern 1051d. If V0 differs greatly from V2', V3', and/or V4', it is necessary to apply a voltage to the second sub-conductive pattern 1051b, the second sub-conductive pattern 1051c and/or the second sub-conductive pattern 1051d to make V0 equal to or substantially equal to V2', V3', and/or V4'. The voltage applied to the second sub-conductive pattern 1051b, the second sub-conductive pattern 1051c and/or the second sub-conductive pattern 1051d, for example, may be V2, V3 and V4 respectively.

Besides, there is a lot of static electricity around the wiring structure. The second conductive pattern 105 having a grid structure formed on the second surface of the base substrate 101 plays a role of shielding an electrostatic. In this way, the interference of external static electricity on the electrical signal of the first conductive pattern 104 on the first surface 102 of the base substrate 101 is avoided, and the occurrence of electrostatic breakdown is avoided.

For example, the wiring structure is applied to an organic light-emitting diode (OLED) substrate. Thin film transistor liquid crystal display (TFT-LCD) uses a stable voltage to control display brightness. Unlike the TFT-LCD, OLED array substrate is driven by current. In a case that the resistance of power lines (for example, VDD or VSS) is large, a large voltage drop is occurred on the VDD, or a large voltage rising is occurred on the VSS, which causes uneven current and uneven display. The connection structure formed by the first conductive pattern and the second conductive pattern in the embodiment of the present disclosure is configured as the power line in the OLED array substrate.

Figure 6:
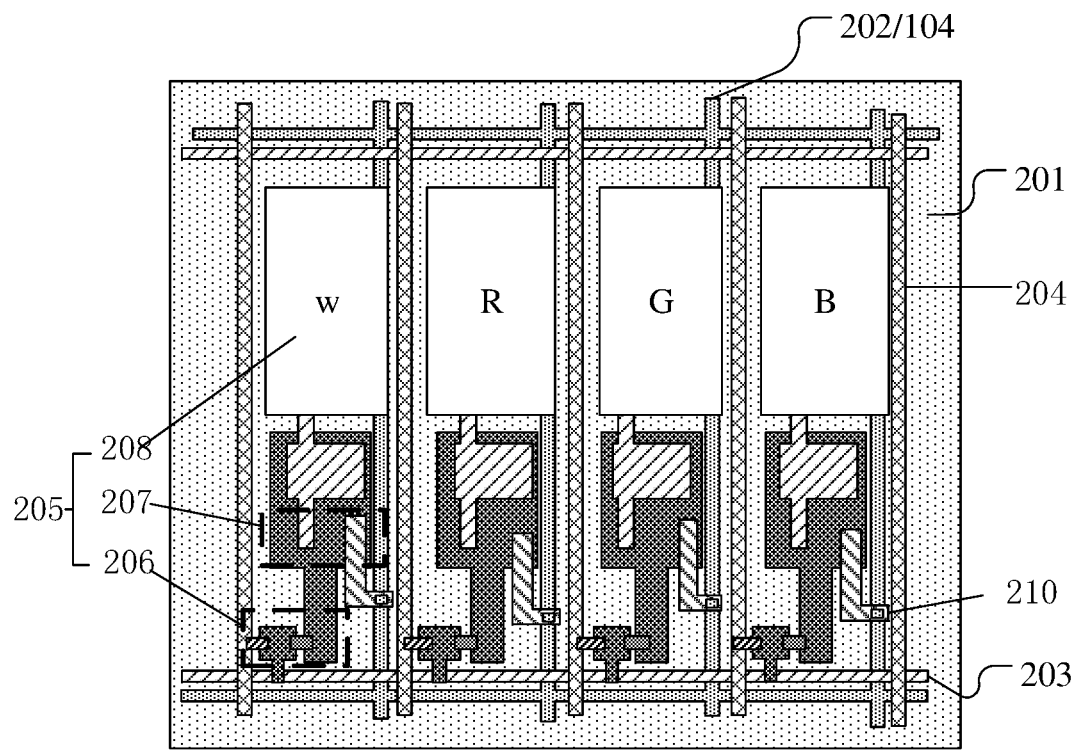
FIG. 6 is a schematic diagram of a planar structure of an organic light-emitting diode (OLED) array substrate provided by an embodiment of the present disclosure.

At least one embodiment of the present disclosure further provides an organic light-emitting diode (OLED) array substrate, FIG. 6 is a schematic diagram of a planar structure of an organic light-emitting diode (OLED) array substrate provided by an embodiment of the present disclosure. As illustrated in FIG. 6, the organic light-emitting diode (OLED) array substrate comprises a base substrate 201, power lines 202, gate lines 203 and data lines 204 on the first surface and the second surface of the base substrate 201, and a pixel structure 205 arranged in a region defined by the gate lines 203 and data lines 204. For example, the power line 202 is any one of the connection structures in the above mentioned embodiments formed by the first conductive pattern 104 and the second conductive pattern 105. The first conductive pattern is a pattern of the power line which is connected with the power terminal in the organic light-emitting diode (OLED) array substrate.

For example, the first conductive pattern is configured as the power line of the OLED array substrate, and the array substrate comprises pixel structures arranged in an array, and each of the pixel structures is connected with the first conductive pattern.

The pixel structure 205 comprises a switching transistor 206, a driving transistor 207 and an OLED device 208. The switching transistor 206 is connected to the gate lines 203 and the data lines 204, and the driving transistor 207 is connected to the switching transistor 206, the power line 202 and the OLED device 208. The first conductive pattern 104 of the power line 202 is arranged below the pixel structure 205 and overlaps with at least a portion of the pixel structure 205. An insulating layer is arranged between the first conductive pattern 104 of the power line 202 and the pixel structure 205 (not illustrated in FIG. 1A and FIG. 1B). The insulating layer is provided with a first via hole structure 210, and the first conductive pattern 104 of the power line 202 is connected to the driving transistor 207 by the first via hole structure 210. The positions of the switching transistor 206 and the driving transistor 207 refer to the corresponding dashed box. The second conductive pattern of the power line 202 is connected to the first conductive pattern through the via hole penetrating through the base substrate 201.

For example, although only four parallel pixel structures are illustrated in FIG. 6, which are used to emit white light (W), red light (R), green light (G) and blue light (B) respectively. However, it should be understood by those skilled in the art that the pixel structure included in the array substrate in the embodiment of the present disclosure is not limited to the four illustrated in FIG. 6, but may includes more than four.

Each of the pixel structures further comprises a storage capacitance, and the storage capacitance comprises a first electrode and a second electrode which are opposite to each other, and a dielectric layer made of an insulating material is arranged between the first electrode and the second electrode. For example, the first electrode is connected to the gate electrode of the driving transistor 207, and the second electrode is connected to the first conductive pattern 104.

For example, the OLED array substrate comprises a display region and a peripheral region outside the display region, the display region is also known as an AA (Active Area) area, and it is generally used for display. The peripheral region is used for arranging driving circuits to encapsulate the display panel and so on. The pixel structure, the gate lines and the data lines are located in the display region. For example, in the OLED array substrate, besides the wirings such as the gate lines and the data lines, the OLED array substrate further includes a detection compensation line for connecting the pixel unit and the detection integrated circuit, and the detection compensation line may be located in the display region.

For example, considering that the region that the gate lines are located is very close to the region that the driving transistor and the storage capacitor are located, the power lines may be arranged to be wider and overlaps with the region that the driving transistor and the storage capacitor are located in a direction perpendicular to the OLED array substrate.

For example, in an example, a region of the power lines (the connection structure formed by the first conductive pattern and the second conductive pattern) corresponding to the pixel structure, the gate lines and the data lines is provided with a hollow structure. It should be noted that, the size of the hollow structure corresponds to the size of the pixel structure, the size of the gate line and the size of the data line. The size of the hollow structure is larger than that of the mesh in the metal grid mentioned above. The main purpose of arranging the hollow structure in the region corresponding to the power line and the pixel structure is to prevent the power lines made of metal material from affecting the transmittance of light. That is to say, the region of the power lines corresponding to the pixel structure is provided with a hollow structure, which increases the transmittance of light and makes full use of incident light. The region of the power lines corresponding to the gate lines and the data lines is provided with a hollow structure, which mainly prevents the capacitance from forming between the power lines and the gate lines, and between the power lines and the data lines. The hollow structure includes a plurality of discontinuous sub-hollow structures (that is a plurality of sub-hollow structures are spaced apart from each other), which is equivalent to dividing power lines into a plurality of connection regions, which also greatly reduces the voltage drop of the power lines.

For example, in the OLED array substrate, the sub-pixel defining region is provided with a color filter layer. For example, a red sub-pixel, a blue sub-pixel and a green sub-pixel are obtained by combining white OLED devices with the corresponding red color filter layer, blue color filter layer and green color filter layer. The color filter layer is a filter or a light conversion layer (such as a fluorescent layer). For example, a planarization layer is further arranged on the color filter layer.

Figure 7A:
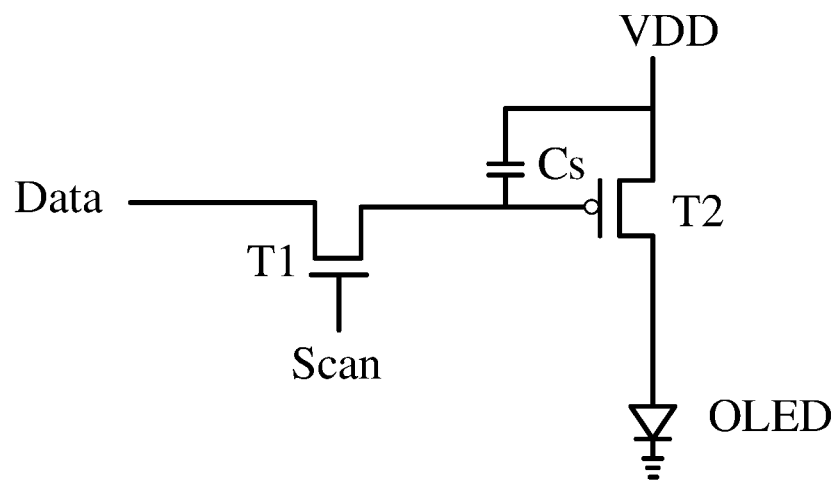
FIG. 7A and FIG. 7B are schematic diagrams of a 2T1C pixel circuit provided by an embodiment of the present disclosure.
Figure 7B:
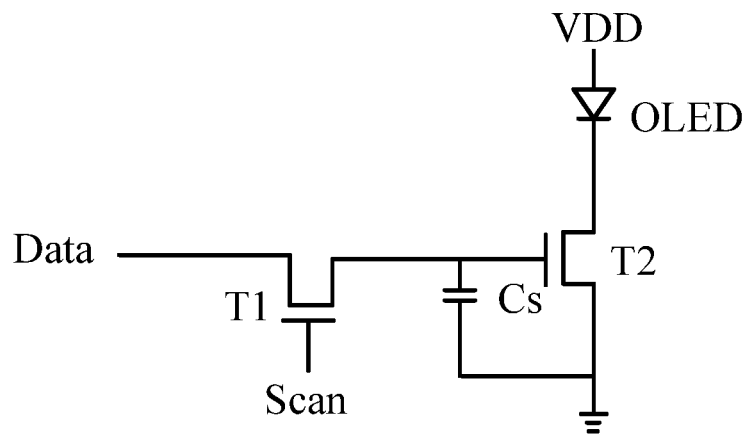

FIG. 7A and FIG. 7B are schematic diagrams of a 2T1C pixel circuit provided by an embodiment of the present disclosure. Combining FIG. 6 with FIG. 7A, it can be seen that the 2T1C pixel circuit comprises a switching transistor T1, a driving transistor T2 and a storage capacitor Cs. For example, a gate electrode of the switching transistor T1 is connected to gate lines (scanning lines) to receive scanning signals (Scan). For example, a source electrode is connected to data lines to receive data signals (Vdata), and drain electrode is connected to a gate electrode of the driving transistor T2. The source electrode of the driving transistor T2 is connected to a first power terminal (Vdd, a high voltage terminal), and the drain electrode is connected to a positive pole of the OLED. One end of the storage capacitor Cs is connected to a drain electrode of the switching transistor T1 and a gate electrode of the driving transistor T2, and another end of the storage capacitor Cs is connected to a source electrode of the driving transistor T2 and the first power terminal. A negative pole of the OLED is connected to the second power terminal (Vss, low voltage terminal), such as the negative pole of the OLED is connected to the ground. The driving mode of the 2T1C pixel circuit is to control the brightness (gray scale) of the pixel by the switching transistor T1, the driving transistor T2 and the storage capacitance Cs. In a case that the scan signal Scan is applied by the gate lines to turn on the switching transistor T1, the data driving circuit output the data voltage (Vdata) through the data lines and charges the storage capacitor Cs by the switching transistor T1. Therefore, the data voltage is stored in the storage capacitor Cs, and the stored data voltage controls the conduction degree of the driving transistor T2, thereby the current flowing through the driving transistor to drive OLED luminescence is controlled, that is, the current determines the gray level of the pixel luminescence. In the 2T1C pixel circuit illustrated in FIG. 7A, the switching transistor T1 is an N-type transistor and the driving transistor T2 is a P-type transistor.

As illustrated in FIG. 7B, another 2T1C pixel circuit comprises the switching transistor T1, the driving transistor T2 and the storage capacitor Cs, but its connection mode changes slightly, and the driving transistor T2 is an N-type transistor. More specifically, the differences between the pixel circuit in FIG. 7B and the pixel circuit in FIG. 7A comprise: the positive pole of the OLED is connected to the first power line (Vdd, high voltage terminal) and the negative pole is connected to the drain electrode of the driving transistor T2, and the source electrode of the driving transistor T2 is connected to the second power terminal (Vss, low voltage terminal), such as the ground. One end of the storage capacitor Cs is connected to the drain electrode of the switching transistor T1 and the gate electrode of the driving transistor T2, and another end of the storage capacitor Cs is connected to the source electrode of the driving transistor T2 and the second power terminal.

In addition, for the pixel circuits as illustrated in FIG. 7A and FIG. 7B, the switching transistor T1 is not limited to the N-type transistor, but may also be a P-type transistor, thus the scan signal (Scan) may be changed by turning on or turning off the switching transistor T1.

It is understandable that, the first conductive pattern is a pattern consisting of a signal line connected with the first power terminal in an organic light-emitting diode (OLED) array substrate, or the first conductive pattern is a pattern consisting of a signal line connected with the second power terminal in an organic light-emitting diode (OLED) array substrate.

For example, in the embodiment of the present disclosure, the pixel circuit may also be a 3T1C circuit, a 4T2C circuit, etc. In addition to the above switching transistor and the driving transistor, it may also comprise a compensation transistor, a reset transistor, etc., which is not limited herein.

At least one embodiment of the present disclosure further provides a display device, and the display device comprises any of the above-mentioned OLED array substrates, and the display device may also comprise a gate driving circuit, a data driving circuit and a power, etc. For example, the gate line is connected with the gate driving circuit, the data line is connected with the data driving circuit, and the power line is connected with the power source. The display device is any products or components with a display function such as an OLED panel, a mobile phone, a tablet computer, a TV, a display, a notebook computer, a digital photo frame, a navigator, etc.

The organic light-emitting diode (OLED) array substrate included in the display device according to the embodiment of the present disclosure has a same structure as any one of the above-mentioned OLED array substrate, and its technical effect and implementation principle are the same, which will not be described herein. It should be noted that, according to requirement, the layer structures of the organic light-emitting diode (OLED) array substrate are not limited to the above-mentioned layers, other layer structures may also be included.

The display device further comprises a driving circuit, and the first conductive pattern is connected to the driving circuit and a plurality of second sub-conductive patterns are connected to the driving circuit respectively.

In addition, the display device is in a bottom emitting mode or in a top emitting mode, or in a double-side emitting mode.

Figure 8:
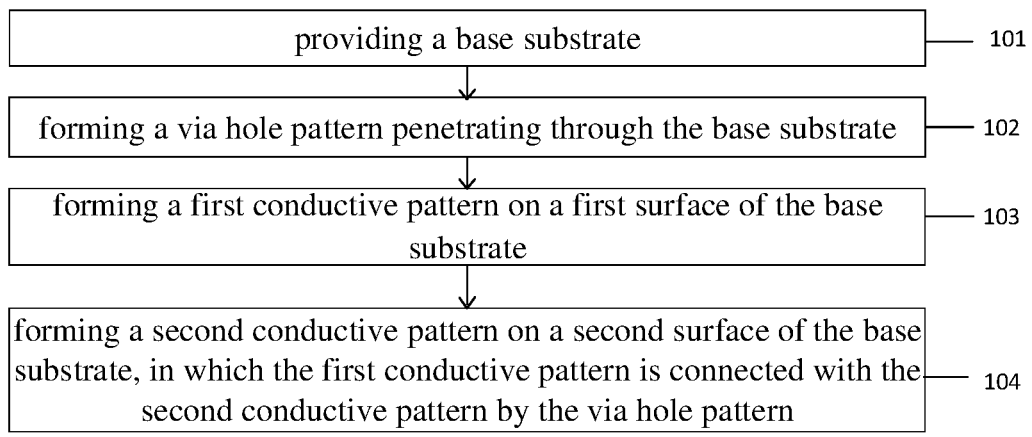
FIG. 8 is a flowchart of a manufacture method of a wiring structure provided by an embodiment of the present disclosure.

At least one embodiment of the present disclosure further provides a manufacture method of the wiring structure. FIG. 8 is a flowchart of a manufacture method of a wiring structure provided by an embodiment of the present disclosure. As illustrated in FIG. 8, the manufacture method includes:

Step 101: providing a base substrate.

For example, the base substrate is an insulating substrate, and the material of the base substrate is glass, quartz, resin material with certain hardness or other suitable materials.

Step 102: forming a via hole pattern penetrating through the base substrate.

For example, the via hole pattern is formed by a laser irradiation method. For example, energy of laser irradiation is 700 mJ to 900 mJ, and the time is 6 seconds to 10 seconds. In an example, the energy of laser irradiation is 800 mJ and the time is 10 seconds. In another example, the energy of laser irradiation is 850 mJ and the time is 9 seconds.

Step 103: forming a first conductive pattern on a first surface of the base substrate.

For example, the first conductive pattern is formed by depositing a metal film firstly, then coating photoresist, exposuring, developing, etching and other process steps. It is understandable that the first conductive pattern may enter the region of the via hole and adhere to the side wall of the via hole.

Step 104: forming a second conductive pattern on a second surface of the base substrate. The first conductive pattern is connected with the second conductive pattern by the via hole pattern. It is understandable that the second conductive pattern may enter the region of the via hole and adhere to the side wall of the via hole.

For example, the first conductive pattern is manufactured by coating photoresist, exposuring, developing, etching and other process steps.

For example, the materials of the first conductive pattern and the second conductive pattern may refer to the relevant descriptions in the above embodiments, which are omitted herein.

For example, the sequence of the above steps 102 and 103 is not limited, which comprises two ways. The first way: forming the via hole pattern penetrating through the base substrate firstly, and then forming the first conductive pattern on the first surface of the base substrate, which can ensure the integrity of the first conductive pattern and the reliability of the electrical connection. The second way: forming the first conductive pattern on the first surface of the base substrate firstly, and then forming the via hole pattern penetrating through the base substrate, which can ensure that the formed via hole pattern is located on the first conductive pattern, and that the positioning accuracy of laser drilling can be ensured.

For example, the via hole pattern comprises a plurality of via holes, which correspond to intersections of the metal lines (strips) extending vertically and horizontally on the first surface of the wiring structure, so as to ensure that the first conductive pattern is connected with the second conductive pattern. For example, a distance between any two of the via holes adjacent to each other in a horizontal direction is equal to and a distance between any two of the via holes adjacent to each other in a vertical direction. The equal interval between any two of the via holes adjacent to each other eliminates the problem that the inconsistency of the length of the lines leads to the large difference of the input electric signals, so as to control the electrical signals input to each second sub-conductive patterns more accurately.

For example, the number of via holes included in the via hole pattern is 1, 2, 3, 4, 8 or more, which is not limited here.

For example, the more the via holes, the more the connected channels are formed, which can further reduce the resistance of the first conductive pattern. For example, distances between any two of the via holes adjacent to each other are not the same. For example, the via holes are only at the positions corresponding to the metal lines (strips) in the horizontal direction, or only at the positions corresponding to the metal lines (strips) in the vertical direction.

For example, a plurality of second sub-conductive patterns are spaced from each other, that is the plurality of the second sub-conductive patterns are not electrically connected to each other on the second surface of the wiring structure. Each of the second sub-conductive patterns corresponds to at least one via hole penetrating through the base substrate, so that each second sub-conductive pattern can be electrically connected to the first conductive pattern through the via hole respectively. For example, each second sub-conductive pattern corresponds to a plurality of via holes at different positions, and each of the second sub-conductive patterns is electrically connected with the first conductive pattern at different positions, thus further reducing the resistance of the first conductive pattern.

For example, the second sub-conductive pattern has a structure in a grid shape, and the shapes of second sub-conductive patterns are the same or are different from each other. For example, the shape of the second sub-conductive pattern is not limited to a rectangle, but may also be a circle, a regular polygon, a trapezoid or an irregular polygon, etc.

The wiring structure and a manufacture method thereof, an organic light-emitting diode (OLED) array substrate and a display device provided by the embodiments of the present disclosure have at least one beneficial effect as follows:

(1) In the wiring structure provided by at least one embodiment of the present disclosure, the first conductive pattern is electrically connected with the second conductive pattern by the via hole pattern penetrating through the base substrate, which reduces the resistance of the first conductive pattern, thereby the voltage drop on the first conductive pattern is reduced.

(2) In the wiring structure provided by at least one embodiment of the present disclosure, the first conductive pattern is connected to the second sub-conductive patterns which are spaced apart from each other through the via holes respectively, in this way, the voltage at the junction of the first conductive pattern and a second sub-conductive pattern in a small region can be adjusted by controlling the input voltage of a second sub-conductive pattern individually.

(3) In the wiring structure provided in at least one embodiment of the present disclosure, the second conductive pattern having a grid structure formed on the second surface of the base substrate plays a role of shielding an electrostatic, in this way, the interference of external static electricity on the electrical signal of the first conductive pattern on the first surface of the base substrate is avoided, and the occurrence of electrostatic breakdown is avoided.

(4) In the OLED array substrate provided in at least one embodiment of the present disclosure, the voltage rising or the voltage drop in the first conductive pattern is almost close to zero by controlling the input voltage in a small region individually, in this way, the uniformity of display is improved in a case that the wiring structure is applied to the display panel.

Please note that:

(1) the drawings of the embodiments of the present disclosure are only related to the structures mentioned in the embodiments of the present disclosure, and other structures can be further obtained by general designs;

(2) for the sake of clarity, sizes of layers or regions in the drawings for describing the embodiments of the present disclosure are not drawn according to an actual scale but are exaggerated or diminished; and (3) the embodiments of the present disclosure and the features therein can be combined with each other in the absence of conflict.

What is described above is related to only the illustrative embodiments of the disclosure and not limitative to the scope of the disclosure. The scope of the disclosure is defined by the accompanying claims.

What is claimed is:

1. An organic light-emitting diode (OLED) array substrate, comprising:
   a base substrate comprising a first surface and a second surface which are opposite to each other;
   a first conductive pattern arranged on the first surface of the base substrate and a second conductive pattern arranged on the second surface of the base substrate;
   wherein the first conductive pattern is connected with the second conductive pattern through a via hole pattern penetrating through the base substrate;
   both the first conductive pattern and the second conductive pattern are configured as power lines of the OLED array substrate; and
   the second conductive pattern comprises a plurality of second sub-conductive patterns spaced apart from each other, a surface of each of the second sub-conductive patterns close to the first conductive pattern is in direct contact with the second surface of the base substrate, a surface of each of the second sub-conductive patterns away from the first conductive pattern is not in contact with the second surface of the base substrate, and side surfaces of each of the second sub-conductive patterns are not in contact with the base substrate;
   wherein the via hole pattern comprises a plurality of via holes, and the first conductive pattern is connected with each of the second sub-conductive patterns through the via holes respectively, and each of the second sub-conductive patterns has a structure in a grid shape.

2. The organic light-emitting diode (OLED) array substrate according to claim 1, wherein the OLED array substrate comprises pixel structures which are arranged in an array, and each of the pixel structures is connected with the first conductive pattern.

3. The organic light-emitting diode (OLED) array substrate according to claim 1, wherein the via holes are arranged at equal interval.

4. A display device, comprising the organic light-emitting diode (OLED) array substrate according to claim 1.

5. The display device according to claim 4, further comprising a driving circuit, wherein the first conductive pattern is connected to the driving circuit, and the plurality of the second sub-conductive patterns are connected to the driving circuit respectively.

6. A wiring structure, comprising:
   a base substrate comprising a first surface and a second surface which are opposite to each other;
   a first conductive pattern arranged on the first surface of the base substrate and a second conductive pattern arranged on the second surface of the base substrate;
   wherein the first conductive pattern is connected with the second conductive pattern through a via hole pattern penetrating through the base substrate; and
   the second conductive pattern comprises a plurality of second sub-conductive patterns spaced apart from each other, a surface of each of the second sub-conductive patterns close to the first conductive pattern is in direct contact with the second surface of the base substrate, a surface of each of the second sub-conductive patterns away from the first conductive pattern is not in contact with the second surface of the base substrate, and side surfaces of each of the second sub-conductive patterns are not in contact with the base substrate;

wherein the via hole pattern comprises a plurality of via holes, and the first conductive pattern is connected with each of the second sub-conductive patterns through the via holes respectively, and each of the second sub-conductive patterns has a structure in a grid shape.

7. The wiring structure according to claim 6, wherein the via holes are arranged at equal interval.

8. A manufacturing method of a wiring structure, comprising:
providing a base substrate;
forming a via hole pattern penetrating through the base substrate;
forming a first conductive pattern on a first surface of the base substrate; and
forming a second conductive pattern on a second surface of the base substrate;
wherein the first conductive pattern is connected with the second conductive pattern through the via hole pattern; and
the second conductive pattern comprises a plurality of second sub-conductive patterns spaced apart from each other, a surface of each of the second sub-conductive patterns close to the first conductive pattern is in direct contact with the second surface of the base substrate, a surface of each of the second sub-conductive patterns away from the first conductive pattern is not in contact with the second surface of the base substrate, and side surfaces of each of the second sub-conductive patterns are not in contact with the base substrate;

wherein the via hole pattern comprises a plurality of via holes, and the first conductive pattern is connected with each of the second sub-conductive patterns through the via holes respectively, and each of the second sub-conductive patterns has a structure in a grid shape.

9. The manufacturing method according to claim 8, wherein the via hole pattern is formed by a laser irradiation method.

10. The manufacturing method according to claim 8, comprising:
forming the via hole pattern penetrating through the base substrate firstly, and then forming the first conductive pattern on the first surface of the base substrate.

11. The manufacturing method according to claim 8, comprising:
forming the first conductive pattern on the first surface of the base substrate firstly, and then forming the via hole pattern penetrating through the base substrate.

12. The manufacturing method according to claim 9, comprising:
forming the via hole pattern penetrating through the base substrate firstly, and then forming the first conductive pattern on the first surface of the base substrate.

13. The manufacturing method according to claim 9, comprising:
forming the first conductive pattern on the first surface of the base substrate firstly, and then forming the via hole pattern penetrating through the base substrate.

\* \* \* \* \*